US012581993B2

(12) United States Patent
Paques et al.

(10) Patent No.: US 12,581,993 B2
(45) Date of Patent: Mar. 17, 2026

(54) ASSEMBLY FOR A POWER MODULE, POWER MODULE AND METHOD FOR PRODUCING AN ASSEMBLY FOR A POWER MODULE

(71) Applicant: Hitachi Energy Ltd, Zürich (CH)

(72) Inventors: Gontran Paques, Birrwil (CH); Andreas Roesch, Murg (DE); Roman Ehrbar, Zürich (CH)

(73) Assignee: Hitachi Energy Switzerland AG, Baden (CH)

( * ) Notice: Subject to any disclaimer, the term of this patent is extended or adjusted under 35 U.S.C. 154(b) by 566 days.

(21) Appl. No.: 17/992,190

(22) Filed: Nov. 22, 2022

(65) Prior Publication Data

US 2023/0163036 A1 May 25, 2023

(30) Foreign Application Priority Data

Nov. 24, 2021 (EP) .................................... 21210204

(51) Int. Cl.
*H01L 23/24* (2006.01)
*H01L 23/053* (2006.01)
*H05K 7/20* (2006.01)

(52) U.S. Cl.
CPC ............ *H01L 23/24* (2013.01); *H01L 23/053* (2013.01); *H05K 7/20918* (2013.01)

(58) Field of Classification Search
CPC ......... H01L 23/041; H01L 23/053–057; H01L 23/528–5286; H01L 23/5386; H01L 23/3121–315; H01L 23/562; H01L 23/24
See application file for complete search history.

(56) References Cited

U.S. PATENT DOCUMENTS

| | | | |
|---|---|---|---|
| 2009/0096072 A1 | 4/2009 | Balakrishnan et al. | |
| 2010/0127389 A1 | 5/2010 | Obiraki et al. | |
| 2011/0108963 A1 | 5/2011 | Balakrishnan et al. | |
| 2014/0021638 A1 | 1/2014 | Mahler et al. | |
| 2019/0355632 A1* | 11/2019 | Taniguchi | H01L 25/072 |
| 2019/0363029 A1 | 11/2019 | Guillon et al. | |
| 2021/0118815 A1* | 4/2021 | Kosugi | H01L 23/24 |

FOREIGN PATENT DOCUMENTS

| | | |
|---|---|---|
| JP | 2000340718 A | 12/2000 |
| JP | 2001007451 A | 1/2001 |
| JP | 2009224445 A | 10/2009 |
| WO | 2019011890 A1 | 1/2019 |

OTHER PUBLICATIONS

Matweb reference for epoxy resin and silicone (Year: 1998).*

* cited by examiner

*Primary Examiner* — Zandra V Smith
*Assistant Examiner* — Douglas Yap
(74) *Attorney, Agent, or Firm* — Slater Matsil, LLP

(57) ABSTRACT

An assembly for a power module includes an electrically isolating base body and first and second electrically conductive structures embedded in the base body. The first and electrically conductive structures are configured to carry different voltages during normal operation of the power module. The first and the second electrically conductive structure each comprise a first region that is not covered by the base body. The first region of the first conductive structure is arranged in a hole of the base body and is retracted with respect to an opening of the hole. The hole is filled with an electrically isolating material that covers the first region of the first conductive structure.

20 Claims, 5 Drawing Sheets

ASSEMBLY FOR A POWER MODULE, POWER MODULE AND METHOD FOR PRODUCING AN ASSEMBLY FOR A POWER MODULE

CROSS-REFERENCE TO RELATED APPLICATIONS

This application claims the benefit of European Patent Application No. 21210204.0, filed on Nov. 24, 2021, which application is hereby incorporated herein by reference.

TECHNICAL FIELD

The present disclosure relates to an assembly for a power module, a power module and a method for producing an assembly for a power module.

BACKGROUND

Power modules are widely used for power conversion equipment such as industrial motor drives, embedded motor drives, uninterruptible power supplies, AC-DC power supplies and in welder power supplies. Power modules are also widely found in inverters for renewable energies such as wind turbines, solar power panels, tidal power plants and electric vehicles (EVs).

There is a need for an improved assembly for a power module, e.g. for an assembly which can be easily produced and fulfills predetermined requirements for creepage and clearance distances, e.g., for high voltage application, like for voltage classes above 1 kV, and/or for a space-constrained assembly for a power module which may experience enhanced electrical stress. Moreover, there is a need for an improved method for producing such an assembly.

SUMMARY

Embodiments of the disclosure relate to an improved assembly for a power module. Other embodiments of the present disclosure relate to a power module comprising such an assembly and a method for producing such an assembly.

In a first embodiment, an assembly for a power module comprises an electrically isolating base body. A first and a second electrically conductive structure are both embedded in the base body. The first and the second electrically conductive structure are configured to be on different electrical potentials during normal operation of the power module. The first and the second electrically conductive structure each comprise at least one first region which is not covered by the base body. At least one first region of at least one of the first and the second electrically conductive structure is covered by an electrically isolating material. At least one first region of at least one of the first and the second electrically conductive structure is arranged in a hole of the base body and is retracted with respect to an opening of the hole. The at least one first region being arranged in the hole is covered with the electrically isolating material.

Other embodiments and features are described below.

BRIEF DESCRIPTION OF THE DRAWINGS

FIG. 1 is a schematic view of an assembly for a power module according to a first exemplary embodiment;

FIGS. 2 and 3 show an alternative of a power module in different views, where FIG. 3 is a cross-sectional view of the plan view of FIG. 2 along the A-A' line;

FIG. 5 is a cross-sectional view of the plan view of FIG. 4 along the A-A' line;

DETAILED DESCRIPTION OF ILLUSTRATIVE EMBODIMENTS

Figure 3:
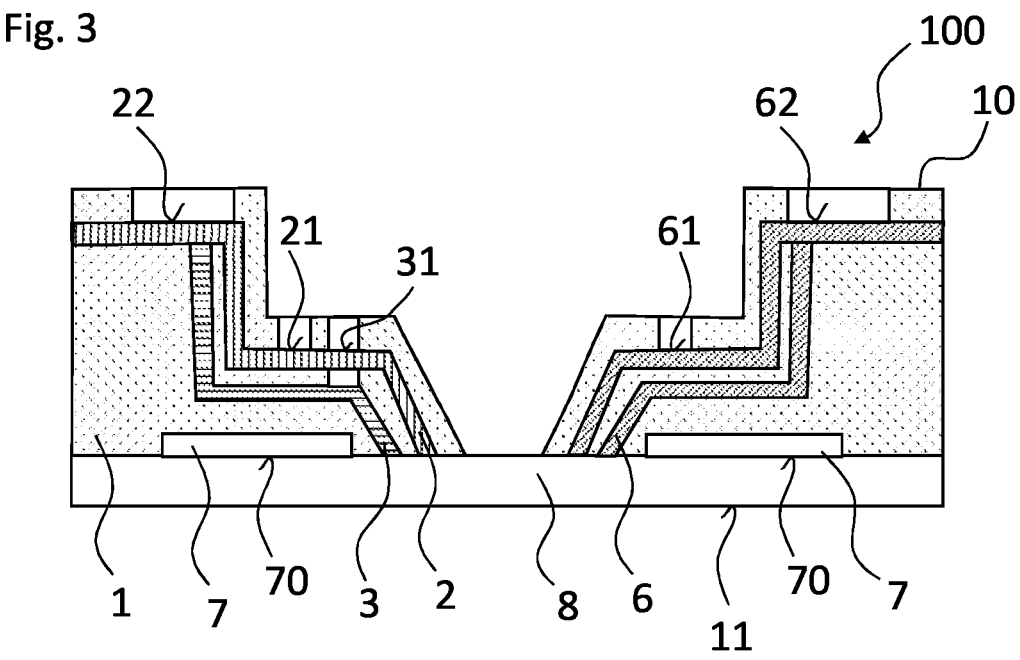

Embodiments of the disclosure relate to an improved assembly 10 for a power module 100. Other embodiments of the present disclosure relate to a power module 100 comprising such an assembly 10 and a method for producing such an assembly 10.

According to an embodiment of the assembly 10 for a power module 100, the assembly 10 comprises an electrically isolating base body 1, and a first 2 and a second 3 electrically conductive structure both embedded in the base body 1. The first 2 and the second 3 electrically conductive structure are configured to be on different electrical potentials during normal operation of the power module 100. For example, the first electrically conductive structure 2 can be coupled to a first electrical potential and the second electrically conductive structure 3 can be coupled to a second electrical potential that is different that the first electrical potential. The first 2 and the second 3 electrically conductive structures each comprise at least one first region 21, 31 which is not covered by the base body 1. At least one first region 21, 31 of at least one of the first 2 and the second 3 electrically conductive structure is covered by an electrically isolating material 5.

The electrically isolating base body 1 may comprise or consist of one or more of: plastic, thermoplastic resin, polyamide, polybutylenterephthalate (PBT), thermosetting resin, epoxy resin. The base body 1 may comprise fillers, e.g., inorganic fillers, like glass fibers, distributed in the mentioned materials. The base body 1 may be formed in one piece or may be formed integrally, respectively. The base body 1 may be free of internal interfaces. For example, the base body 1 is a molded body, e.g., an injection molded body or a transfer molded body. The base body 1 may be a housing body of the assembly 10.

The first 2 and the second 3 electrically conductive structure may comprise or may consist of metal, e.g., copper or copper alloy with an optional metallic coating. The first 2 and the second 3 electrically conductive structure may be electrically isolated from each other, e.g., by the base body 1 or by a further support element, like an insulating plate between the conductive structures. The insulating plate may be formed of a different material than the base body 1. "Normal operation" herein means an operation mode, for which the power module 100 is intended.

The base body 1 may mechanically support the electrically conductive structures and/or may hold the electrically conductive structures in position relative to each other. The first 2 and the second 3 electrically conductive structures may be terminal structures of the assembly 10, e.g., power terminals.

The first 2 and the second 3 electrically conductive structure may each comprise one or more first regions. Here and in the following, all features disclosed in connection with one first region, e.g., its geometrical properties or its coverage with the electrically isolating material 5, are also disclosed for the other first regions.

The first region of the first 2 and the second 3 electrically conductive structure are, e.g., a surface region of the respective electrically conductive structure 2, 3. The first regions are, e.g., regions which are different from terminal regions of the electrically conductive structures. Terminal regions may be parts of the electrically conductive structures which are configured to be externally electrically connected for operating the power module 100. The first regions, however, are not arranged for any electrical connection. For example, during normal operation of the power module 100, current is neither injected nor extracted via the first regions. The first regions are, e.g., free of any electrical conductors different from the electrically conductive structure itself.

The electrically isolating material 5 may comprise or consist of one or more of: organic material, plastic, silicone gel, glue, polyurethane, epoxy resin, inorganic material or organic material filled with inorganic particles, like ceramic particles or fibers. The electrically isolating material 5 may be the same material as the material of the base body 1 or may be different from the material of the base body 1. Particularly, the electrically isolating material 5 is a material applied separately and/or independently of the material of the base body 1. The electrically isolating material 5 is not formed in one piece with the base body 1. The electrically isolating material 5 may be in direct contact with the base body 1 but an interface is then formed between the base body 1 and the electrically isolating material 5 in the region where they contact each other.

The at least one first region 21, 31 covered by the electrically isolating material 5 is, e.g., completely covered by the electrically isolating material 5. For example, the first region is covered such that no part of the first region is externally accessible.

The assembly 10 may also comprise one or more further electrically conductive structures. The at least one further electrically conductive structure may be configured to be on a different electrical potential than the first and/or the second electrically conductive structure during use of the power module 100. Also the at least one further electrically conductive structure may comprise at least one first region 21, 31. Also at least one first region 21, 31 of the at least one further electrically conductive structure may be covered by the electrically isolating material 5. All features disclosed in connection with the first 2 and the second 3 electrically conductive structure, e.g., concerning the assigned at least one first region 21, 31, are also disclosed for the at least one further electrically conductive structure.

The further electrically conductive structure(s) may be auxiliary terminal structure(s), like gate terminal(s), base terminal(s), auxiliary emitter terminal(s) or auxiliary source terminal(s) or auxiliary collector terminal(s) or auxiliary drain terminal(s) or output terminal(s), like AC-terminal(s), e.g., of a half-bridge module.

The assembly 10 disclosed herein is, inter alia, based on the recognition that assemblies with electrically conductive structures, like main and auxiliary terminal structures, embedded into an electrically isolating base body 1 can be realized by an injection molding process or transfer molding process or another molding process, where the electrically conductive structures are molded with the material of the base body 1. During this molding process, the electrically conductive structures need to be fixed with positioning pins to keep the structures at the right position. After the molding process, the pins are pulled back leaving the electrically conductive structures partly exposed to the environment due to openings. Theses exposed parts, herein referred to as first regions, of the different electrically conductive structures are on different electric potentials during normal operation. Consequently, a way of electrical creepage is available between these first regions.

Especially for high voltage power semiconductor modules of voltage classes of 3.3 kV and more, preventing electrical creepage on the surface of the base body 1 is a challenge. A sufficient electrical isolation between different electrically conductive structures, e.g., emitter, collector and baseplate, must be provided with certain required clearance and creepage distances. The required creepage and clearance distances depend on the voltage class of the power module 100, the base body 1 material (comparative tracking index—CTI value), and the surface geometry (flat surface or incorporation of ribs of the base body 1). Rules for a correct design are provided by the standards IEC 60664-1 and EN 50124-1. Because of limitations of geometry and requirements with respect to the positioning of the fixation pins in the molding process, the fulfilment of the requirements of creepage and clearance distances between the first regions of the electrically conductive structures of different electrical potential may be difficult or cannot be achieved.

The improvement or even better the elimination of the creepage and clearance distance between the first regions of the electrically conductive structures having different potential is a challenge for the realization of assemblies with a molded base body 1. With the disclosed assembly 10, the required creepage and clearance distances can be met. One or several of the first regions, where the electrically conductive structures are exposed to the environment, are filled or covered with isolating material, like dielectric gel or resin. With a covered first region, the creepage distance no longer applies since the potentials are separated by the isolating material. Thus, the way for electrical creepage is eliminated. Without the creepage and clearance requirements, the degree of freedom for the design of the assembly 10 is significantly increased.

According to a further embodiment of the assembly 10, said assembly 10 is configured for a power module 100 in which, during normal operation, a voltage difference between the first 2 and the second 3 electrically conductive structure of at least 1000 V or at least 2000 V are at least 3000 V or at least 4000 V or at least 5000 V or at least 6000 V appears or may appear.

According to a further embodiment of the assembly 10, the assembly 10 is designed such that, without at least one first region 21, 31 of the first 2 and the second 3 electrically conductive structures being covered by the electrically isolating material 5, the power module 100 would not fulfill predetermined requirements of creepage and clearance distances. For example, the distances between two first regions 21, 31 of the first 2 and second 3 electrically conductive structures would not fulfill the predetermined requirements unless at least one of the two first regions would be covered by the electrically isolating material 5. For example, the predetermined requirements are the requirements for creepage and clearance distance according to IEC 60664-1:2020 and/or EN 50150124-1:2017.

According to a further embodiment of the assembly 10, at least one first region 21, 31 of at least one of the first 2 and the second 3 electrically conductive structure is arranged in a hole of the base body 1. The first region may be retracted with respect to the opening of the hole. "Retracted" means that the first region is offset with respect to the opening in a direction to the interior of the base body 1. The opening of the hole is the region of the hole being flush with the surface, e.g., an outer surface, of the base body 1. In other words, at least one first region 21, 31 may be retracted with respect to the surface of the base body 1. The size or area of the first region in the hole may be defined by the diameter of the hole. The opening may have a round or oval or rectangular shape, but other shapes are also possible. The opening is, e.g., arranged at an outer side of the base body 1, e.g., on a top side or lateral side of the base body 1 or the assembly 10, respectively.

According to a further embodiment of the assembly 10, the at least one first region 21,31 being arranged in the hole is covered with the electrically isolating material 5.

According to a further embodiment of the assembly 10, the first region is retracted with respect to the opening of the hole by at least 0.3 mm or at least 0.5 mm or at least 0.7 mm or at least 1.5 mm. Additionally or alternatively, the first region is retracted with respect to the opening by at most 7 mm or at most 5 mm or at most 3 mm.

According to a further embodiment of the assembly 10, the opening of the hole has a diameter of at least 2 mm or at least 5 mm. Additionally or alternatively, the diameter of the hole may be at most 10 mm or at most 7 mm. The diameter of the hole may be the same as the diameter of the opening all the way down from the opening to the first region. The hole may have a cylindrical shape.

According to a further embodiment of the assembly 10, with respect to a bottom side 11 of the assembly 10, at least one first region 21, 31 of at least one of the first 2 and the second 3 electrically conductive structure is arranged on a different height than a mounting region 70 for a power electronic component 7 of the power module 100. For example, the first region is further away from the bottom side 11 than the mounting region 70, e.g., at least 2 mm or at least 5 mm further away. The bottom side 11 of the assembly 10 is, e.g., a main side of the assembly 10. For example, a maximum thickness of the assembly 10, measured perpendicularly to the bottom side 11, is smaller than any extension of the bottom side 11. The bottom side 11 may be flat within the limits of manufacturing tolerances or may comprise fins or ribs, e.g., for cooling. The top side of the assembly 10 is opposite to the bottom side 11.

According to a further embodiment of the assembly 10, the assembly 10 comprises a carrier, e.g., a connection carrier. The carrier may comprise an isolating substrate, e.g., of ceramic or resin, and top and bottom metallizations. Alternatively, the carrier may be a base plate with an isolating substrate. Further alternatively, the carrier may comprise an insulated metal baseplate with a metal substrate, a resin sheet and a circuit metallization. Also possible is a carrier in form of a printed circuit board, PCB for short. The electrically conductive structures may be electrically connected to the carrier. A region on a surface of the carrier may be the mounting region 70 for the power electronic component 7. For example, a bottom side 11 of the carrier forms the bottom side 11 of the assembly 10. The mounting region 70 may be on the top side of the carrier, opposite to the bottom side 11.

According to a further embodiment of the assembly 10, a surface of the base body 1 extends continuously between two first regions 21, 31 of the first 2 and the second 3 electrically conductive structures. The contiguous surface may comprise sidewalls of the holes and/or an outer surface of the base body 1. The contiguous surface may comprise corrugations, like ribs. A creepage current could potentially flow along this contiguous surface, unless one of the first regions would be covered by the electrically isolating material 5.

According to a further embodiment of the assembly 10, the electrically isolating material 5 covering at least one of these first regions 21, 31 adjoins the surface of the base body 1 extending continuously between the two first regions 21, 31. For example, in a region where the surface of the base body 1 and the electrically insulating material are in direct contact with each other, an interface is formed between the base body 1 and the electrically isolating material 5.

According to a further embodiment of the assembly 10, the base body 1 and the electrically isolating material 5 are formed from different materials. Alternatively, the base body 1 and the electrically isolating material 5 are formed of the same material but are not formed in one piece.

According to a further embodiment of the assembly 10, the first 2 and the second 3 electrically conductive structure each comprise at least one second region 22, 32 not covered by the base body 1. For example, the second regions 22, 32 are not covered by an electrically isolating material 5.

According to a further embodiment of the assembly 10, the second regions 22, 32, in contrast to the first regions, are provided for externally electrically contacting the respective electrically conductive structure 2, 3. For example, the second regions 22, 32 are exposed, i.e., freely accessible, and/or are electrically contacted to further electrical conductors. The second regions 22, 32 may be terminal regions of the electrically conductive structures.

The second regions 22, 32 may have different shapes than the first regions, e.g., may have larger areas. The second regions 22, 32 may be arranged on different heights than the first regions with respect to the bottom side 11 of the assembly 10, e.g., may be further away from the bottom side 11.

According to a further embodiment, the electrically isolating material 5 is a thermosetting material or a thermoplastic material or an insulating gel, for example a silicone gel or silicone rubber, e.g., with suitable material properties for molding or filling the at least one first region 21, 31. The insulating gel can be molded or filled in the at least one first region 21, 31 or the assigned hole, respectively. The advantage of using an insulating gel as the isolating material is that the gel can bond well with the base body 1 and is compressible (flexible) to withstand thermal stresses during operation of the power module 100, i.e., the insulating gel covering the at least one first region 21, 31 will reliably perform during the expected life time of the power module 100 without any formation of cracks or material degradation caused because of thermal stresses.

According to a further embodiment, the electrically isolating material 5 has a Young's modulus smaller or equal to that of the material of the base body 1. For example, the Young's modulus of the isolating material is at most 90% or at most 50% or at most 10% of the Young's modulus of the material of the base body 1. Additionally or alternatively, the coefficient of thermal expansion, CTE for short, of the isolating material is similar to that of the material of the base body 1. For example, the CTE of the isolating material lies in the range between 50% and 150% or in the range between 80% and 120% or in the range between 90% and 110% of the CTE of the material of the base body 1.

According to a further embodiment, the isolating material is electrically compatible with the material of the base body 1. For example, the isolating material has a dielectric constant which is similar to that of the material of the base body 1, e.g., such that there is no concentration of electric field in the first region or in the base body 1 to cause any partial discharge or associated insulation degradation leading to failure of the power module 100. The dielectric constant of the isolating material may be in the range between 50% and 150% or in the range between 80% and 120% or in the range between 90% and 110% of the dielectric constant of the material of the base body 1. By way of example, the dielectric constant of the isolating material is in the range between 2.5 to 3.5.

According to a further embodiment, the breakdown strength of the isolating material is greater than 10 kV/mm, e.g., at least 15 kV/mm. In this way, the isolating material may withstand the high voltage that gets applied between the first 2 and the second 3 electrically conductive structure during use of the power module 100.

Next, the power module 100 is described. The power module 100 may be a semiconductor power module 100.

In an embodiment of the power module 100, the power module 100 comprises an assembly according to at least one described embodiment. Furthermore, the power module 100 comprises a power electronic component 7. The power electronic component 7 is electrically connected to at least one of the first 2 and the second 3 electrically conductive structures. The power module 100 is configured to be operated with a voltage difference between the first 2 and the second 3 electrically conductive structure.

As a result of the power module 100 comprising at least one embodiment of the assembly 10, all features disclosed in connection with the assembly 10 are also disclosed for the power module 100 and vice versa.

The power electronic component 7 may be a power semiconductor electronic component. The power electronic component 7 may be electrically connected to the first 2 and the second 3 electrically conductive structures.

The first electrically conductive structure may be a drain or collector terminal structure and the second electrically conductive structure may be a source or emitter terminal structure. A third electrically conductive structure may be a base or gate terminal structure. The third electrically conductive structure may also be electrically connected to the power electronic component 7.

The power module 100 may comprise a plurality of power electronic component 7s. All features disclosed herein for one power electronic component 7 are also disclosed for the other power electronic component 7s.

According to a further embodiment of the power module 100, the power electronic component 7 is embedded in the base body 1. For example, the power electronic component 7 is not freely accessible from outside. The power electronic component 7 may have been molded together with the electrically conductive structures.

According to a further embodiment of the power module 100, the power electronic component 7 comprises at least one transistor, e.g., an insulated gate bipolar transistor (IGBT) or a MOSFET, or a thyristor. The power electronic component 7 may be a semiconductor chip or an arrangement of several chips on one common substrate. The power electronic component 7 may comprise one or more discrete devices, like one or more of: resistor, capacitor, inductive component, or diode. The power electronic component 7 may comprise Si, SiC and/or GaN.

The power electronic component 7 may be mounted on a mounting region 70 of a carrier of the power module 100. The power electronic component 7 may be electrically connected to that carrier.

Next, the method for producing an assembly 10 for a power module 100 is described. The method is particularly suitable for producing at least one embodiment of the assembly 10. Therefore, all features disclosed in connection with the assembly 10 are also disclosed for the method and vice versa.

According to an embodiment of the method, the method comprises a step of providing an electrically isolating base body 1 with an embedded first electrically conductive structure and an embedded second electrically conductive structure. The first 2 and the second 3 electrically conductive structure are configured to be on different electrical potentials during normal operation of the power module 100. The first 2 and the second 3 electrically conductive structure both comprise at least one exposed first region which is not covered by the base body 1. The method comprises a further step of covering at least one first region 21,31 of at least one of the first 2 and the second 3 electrically conductive structure with an electrically isolating material 5.

According to a further embodiment of the method, providing the electrically isolating base body 1 with the embedded first and second electrically conductive structure comprises molding the first 2 and the second 3 electrically conductive structure with an electrically isolating mold material. After molding, the mold material may be hardened or cured in order to form the base body 1. The base body 1 may be formed from the mold material.

Molding the electrically conductive structures with the mold material may be done by injection molding or transfer molding or another molding process.

According to a further embodiment of the method, during molding of the first and second electrically conductive structure, the first regions of the first 2 and the second 3 electrically conductive structure are protected from being covered with the mold material by at least one auxiliary structure 201. During molding, the auxiliary structure 201 may completely cover the first regions.

According to a further embodiment of the method, the auxiliary structure 201 is a holding structure for holding the electrically conductive structures in position during molding. For example, during molding, the auxiliary structure 201 is in direct contact with the first regions of the electrically conductive structures.

The auxiliary structure 201 may comprise pins, wherein each pin is assigned to a first region. The pins cover and/or protect the respective first regions during molding.

According to a further embodiment of the method, the auxiliary structure 201 is removed after the molding so that the first regions become exposed. This means that after removing the auxiliary structure 201, the first regions are not covered by the material of the base body 1. Before applying the electrically isolating material 5, the first regions are freely accessible from outside.

Hereinafter, the assembly 10 for a power module 100, the power module 100 and the method for producing an assembly 10 for a power module 100 will be explained in more detail with reference to the drawings on the basis of exemplary embodiments. The figures are included to provide a further understanding. In the figures, elements of the same structure and/or functionality may be referenced by the same reference signs. It is to be understood that the embodiments shown in the figures are illustrative representations and are not necessarily drawn to scale. In so far as elements or components correspond to one another in terms of their function in different figures, the description thereof is not repeated for each of the following figures. For the sake of clarity, elements might not appear with corresponding reference symbols in all figures.

Figures 1, 2:
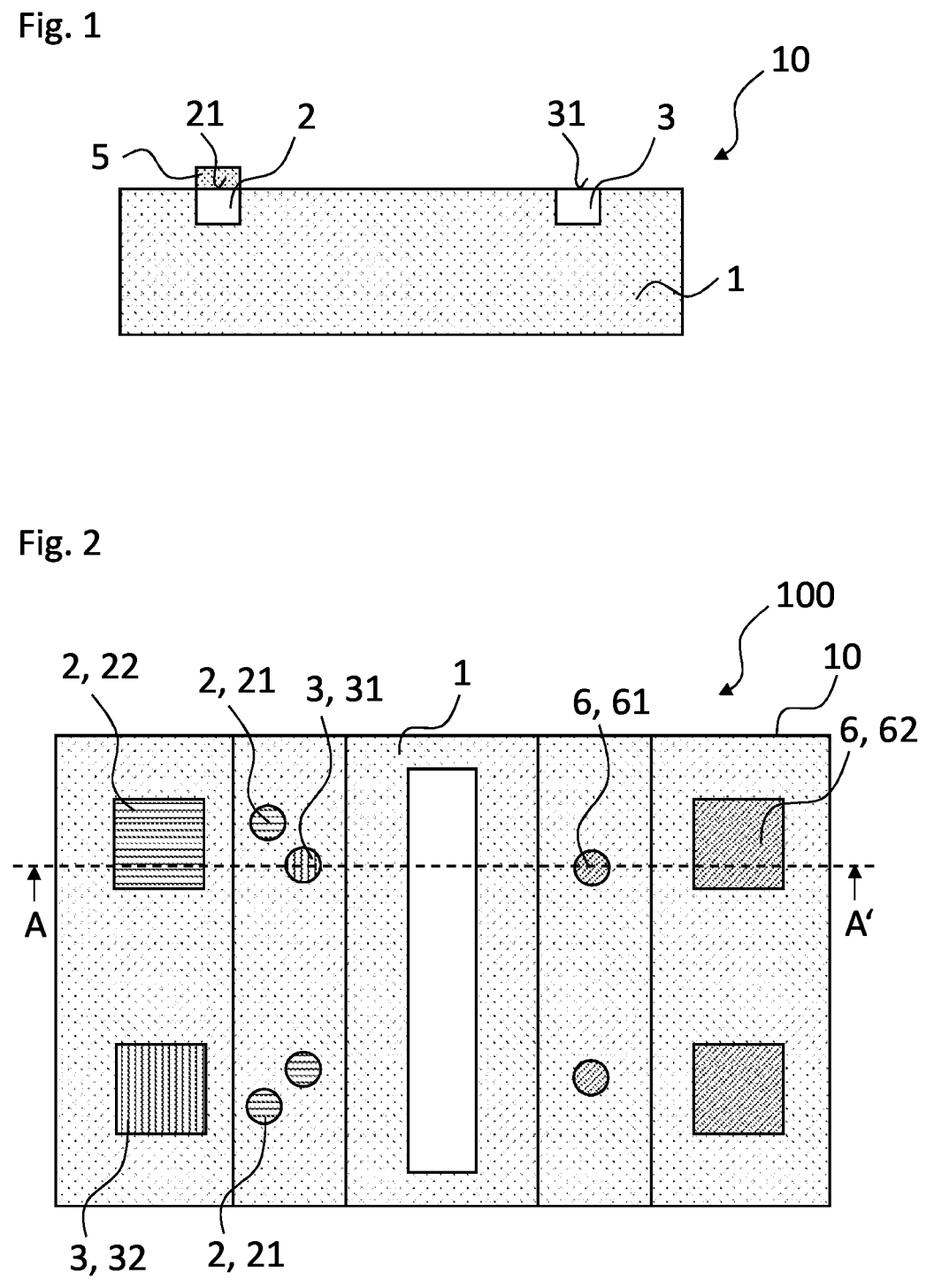

FIG. 1 schematically illustrates a first exemplary embodiment of an assembly 10 for a power module. The assembly 10 comprises a base body 1, which is, e.g., formed of a plastic. A first electrically conductive structure 2 and a second electrically conductive structure 3 are embedded in the base body 1. First regions 21, 31 of the electrically conductive structures 2, 3 are not covered with the base body 1. At least one of the first regions 21, 31 is covered by an electrically isolating material 5. The electrically isolating material 5 may be different from the material of the base body 1.

FIG. 2 shows an example of a power module 100 in top view. FIG. 3 shows the same power module 100 in a cross-sectional view on the plane AA' of FIG. 2. The power module 100 may be a power semiconductor module, e.g., for electric vehicles or railway applications. The power module 100 may be of voltage class of 1.7 kV or of 3.3 kV or more, like 4.5 kV or more or 6.5 kV or more.

The power module 100 comprises an assembly 10. The assembly 10 comprises a base body 1 and electrically conductive structures 2, 3, 6 embedded therein. In FIG. 3, the base body 1 is drawn semitransparent in order to better illustrate further features of the power module 100 and the assembly 10, respectively.

The first electrically conductive structure 2 may be a collector terminal structure, the second electrically conductive structure 3 may be an emitter terminal structure and the third electrically conductive structure 6 may be an output terminal structure. The electrically conductive structures 2, 3, 6 are electrically connected to a carrier 8 of the assembly 10. The carrier 8 is, e.g., a base plate with an isolating substrate. A bottom side of the carrier 8 forms a bottom side of the assembly 10.

As can be seen in FIG. 3, the power module 100 additionally comprises power electronic components 7 in the form of semiconductor chips 7. The electronic components 7 are arranged on mounting regions 70 of the carrier 7. For example, the electronic components 7 are electrically connected to the carrier 7. Via the carrier 7, the electronic components 7 may also be electrically connected to the electrically conductive structures 2, 3, 6.

At the top side of the assembly 10, opposite to the bottom side 11, second regions 22, 32, 62 of the different electrically conductive structures 2, 3, 6 are provided. The second regions 22, 32, 62 are also free of the base body 1 and constitute terminal regions. The terminal regions 22, 32, 62 are exposed so that the electrically conductive structures 2, 3, 6 can be externally electrically and/or mechanically contacted at the terminal regions.

Besides the terminal regions, the three electrically conductive structures 2, 3, 6 each comprise at least one first region 21, 31, 61, in which the electrically conductive structures 2, 3, 6 are also free of the base body 1 and which are exposed. As explained later on, these first regions 21, 31, 61 result from the production of the assembly 10 or the power module 100, respectively. The first regions 21, 31, 61 are not used for external electric connection.

The first regions 21, 31, 61 are each arranged in holes of the base body 1 and are retracted with respect to openings of the holes, i.e. they are lower than a surface of the base body 1. The holes are arranged in a top side of the base body 1. The holes or the openings, respectively, may each have a diameter between 2 mm and 10 mm inclusive. The diameter of the holes also determines the size of the first regions 21, 31, 61. The first regions 21, 31, 61 may be retracted with respect to the opening of the respective hole by at least 0.5 mm and/or at most 5 mm.

As can be best seen in FIG. 2, the distance between one first region 21 of the first electrically conductive structure 2 and one first region 31 of the second electrically conductive structure 3 along the surface of the base body 1 is small. It might be so small that predetermined requirements concerning creepage and/or clearance distances are not fulfilled.

Figure 4:
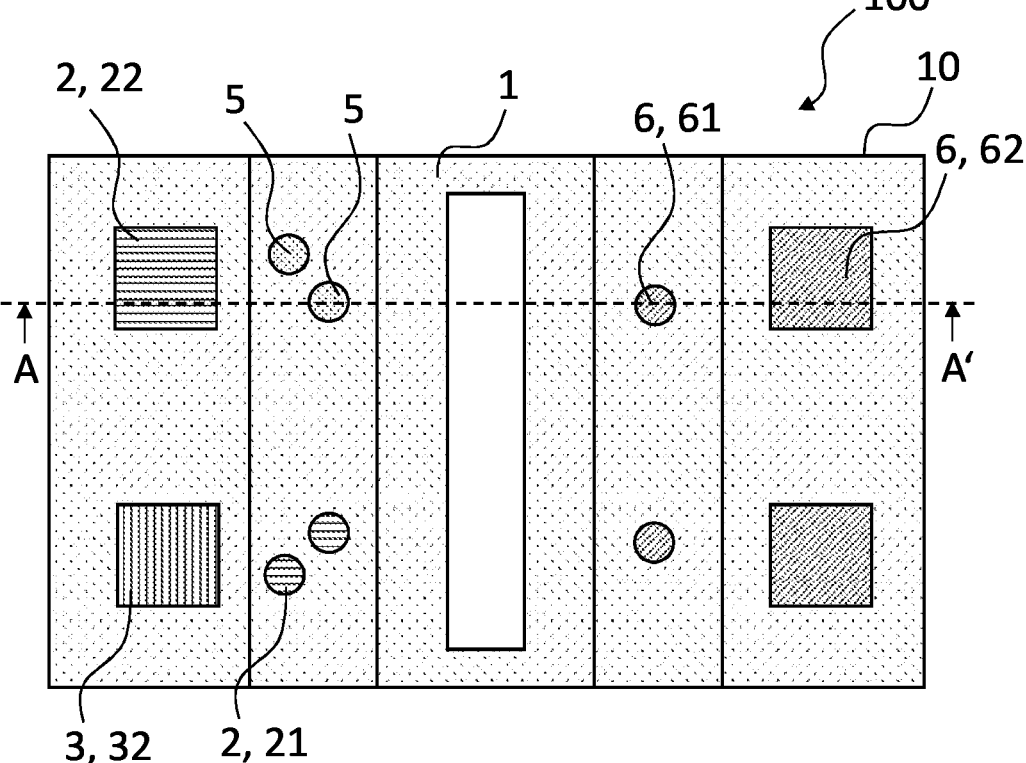
FIGS. 4 and 5 show exemplary embodiments of an assembly for a power module and a power module in different views, where
Figure 5:
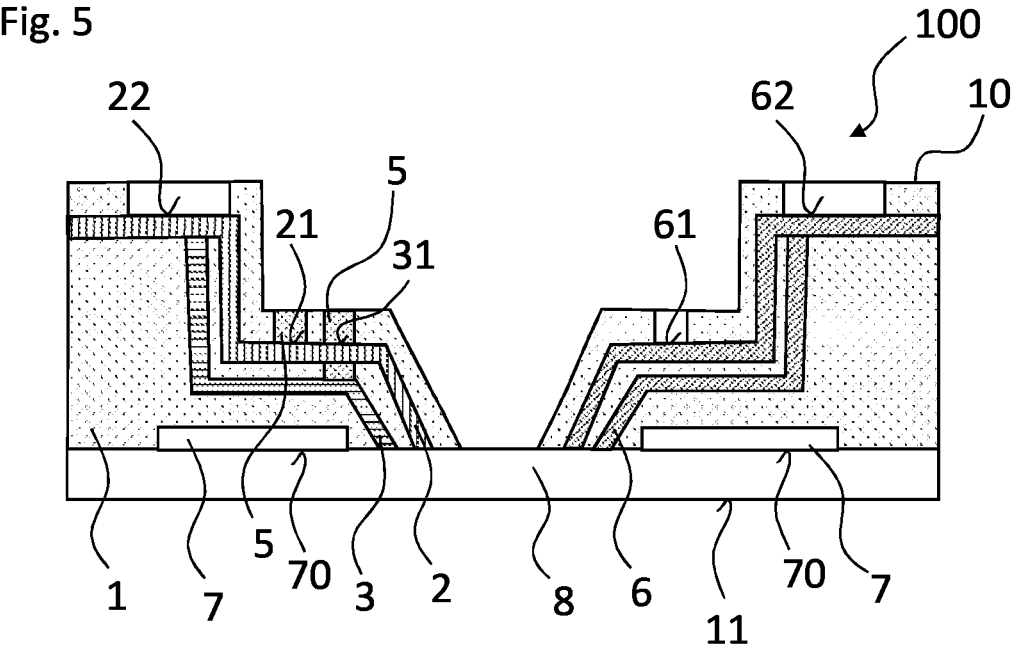

FIGS. 4 and 5 show an exemplary embodiment of the power module 100 and the assembly 10. The power module 100 or the assembly 10, respectively, is essentially the same as in the FIGS. 2 and 3. In the exemplary embodiment of FIGS. 4 and 5, however, the problem of the low creepage distance between the first regions 21,31 is overcome because the holes associated with the first regions 21, 31, are filled with an electrically isolating material 5 so that the first regions 21, 31 are no longer exposed but are covered by the electrically isolating material 5. The electrically isolating material 5 is, e.g., a silicone gel.

Figure 6:
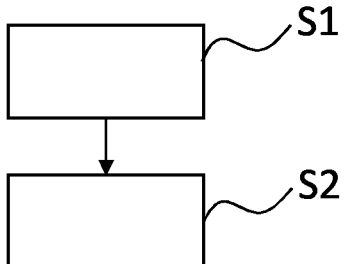
FIG. 6 shows a schematic flowchart of an exemplary embodiment of the method for producing an assembly for a power module.

FIG. 6 shows a schematic flowchart of an exemplary embodiment of the method for producing an assembly for a power module. In a step S1, an electrically isolating base body is provided in which a first and a second electrically conductive structure are embedded. The first and the second electrically conductive structure are configured to be on different electrical potentials during normal operation of the power module. The first and the second electrically conductive structure both comprise at least one exposed, first region which is not covered by the base body, i.e. is free of the base body.

In a step S2, at least one first region of at least one of the first and the second electrically conductive structure is covered with an electrically isolating material.

FIGS. 7 to 10 illustrate a further exemplary embodiment of the method for producing an assembly for a power module. In this case, the power module 100 or the assembly 10 of FIGS. 4 and 5 is produced.

Figure 7:
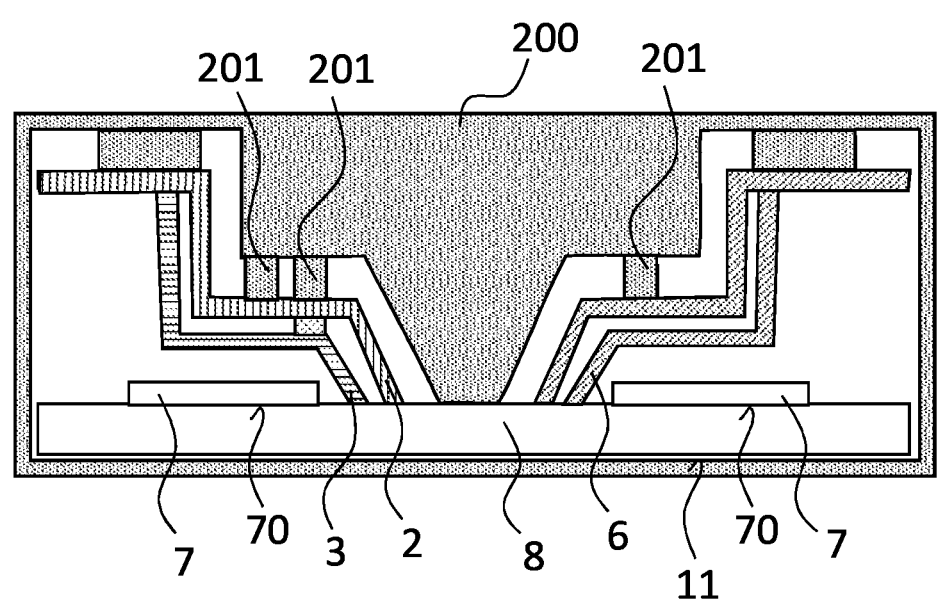
FIGS. 7 to 10 show different positions in a further exemplary embodiment of the method for producing an assembly for a power module.

In FIG. 7, a position is shown in which a first 2, a second 3 and a third 6 electrically conductive structure, all electrically connected to a carrier 8, are positioned in the interior of a mold 200. Auxiliary structures 201 or holding structures 201, respectively, in the form of pins are used to hold the electrically conductive structures 2, 3, 6 in position. The holding structures 201 contact the electrically conductive structures 2, 3, 6 in first regions.

Figure 8:
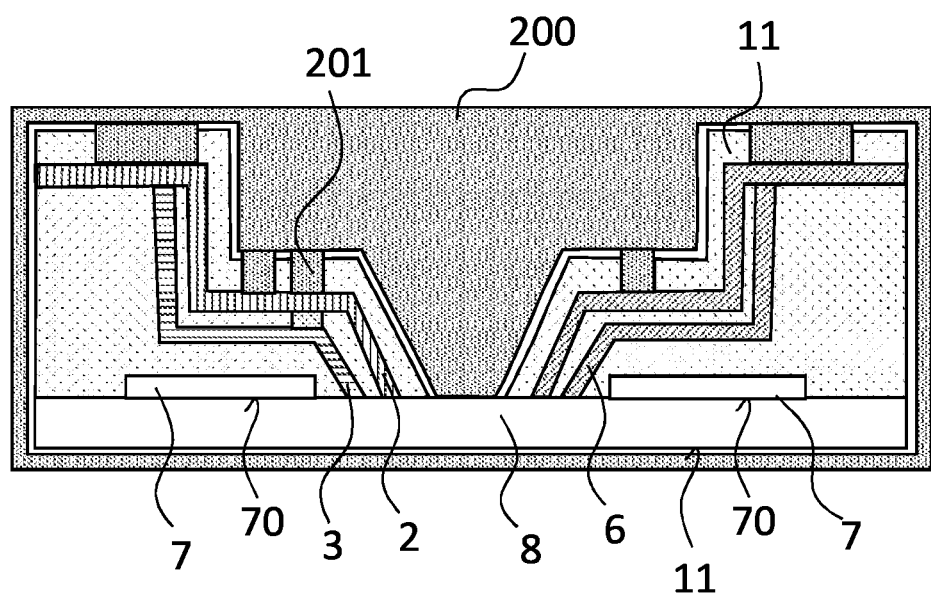

In the position shown in FIG. 8, a molding process, e.g. injection molding or transfer molding, is performed. During this step, the electrically conductive structures 2, 3, 6 are embedded in an electrically isolating mold material. The first regions covered by the auxiliary structures 201 are not covered with the mold material.

For example, by hardening or curing the mold material, the base body 1 is produced. The mold 200 and the holding structures 201 can now be removed (see FIG. 9). Because of the holding structures 201, holes remain in the base body 1 in which the first regions 21, 32, 62 of the electrically conductive structures 2, 3, 6 are exposed.

Figures 9, 10:
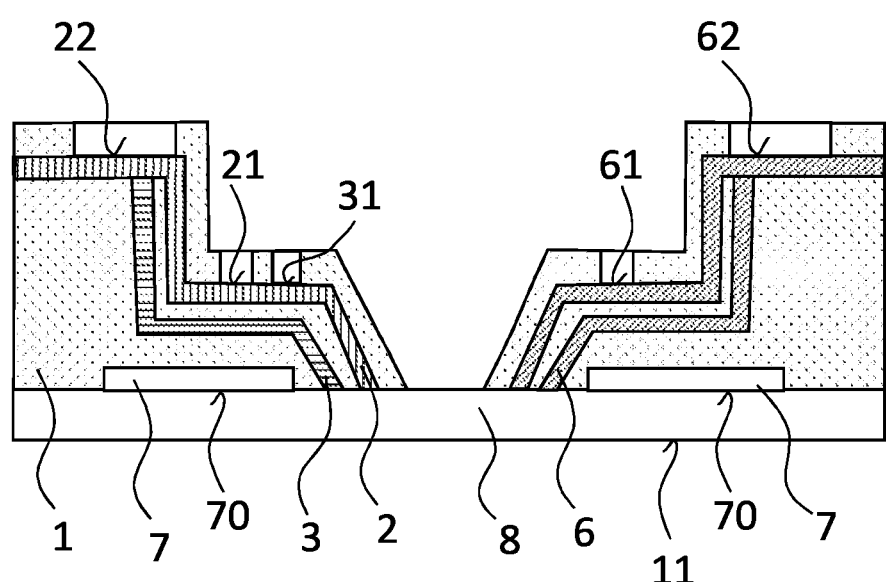

FIG. 10 shows a position in the method, where at least some of the holes are filled with an electrically conductive material 5 so that the first regions 21, 31, 61 are covered with the electrically isolating material 5. In this way, requirements concerning creepage distances can be fulfilled.

The embodiments shown in the FIGS. 1 and 4 to 10 as stated represent exemplary embodiments of the assembly, the power module and the method for producing an assembly. Therefore, they do not constitute a complete list of all embodiments according to the assembly, the power module and the method. Actual assemblies, power modules and methods may vary from the embodiments shown in terms of arrangements, devices and elements for example.

REFERENCE SIGNS 1 base body
2 first electrically conductive structure
3 second electrically conductive structure
5 electrically isolating material
6 third electrically conductive structure
7 power electronic component
8 carrier
10 assembly for a power module
11 bottom side of the assembly
21 first region of first electrically conductive structure
22 second region of first electrically conductive structure
31 first region of second electrically conductive structure
32 second region of second electrically conductive structure
61 first region of third electrically conductive structure
62 second region of third electrically conductive structure
70 mounting region
100 power module
200 mold
201 auxiliary structure
S1 method step
S2 method step

What is claimed is:

1. An assembly for a power module, the assembly comprising:

an electrically isolating base body;

a first electrically conductive structure embedded in the base body, the first electrically conductive structure configured to be coupled to a first electrical potential; and a second electrically conductive structure embedded in the base body, the second electrically conductive structure configured to be coupled to a second electrical potential that is different than the first electrical potential;

wherein the first and the second electrically conductive structures each comprise a first region that is not covered by the base body;

wherein the first region of the first electrically conductive structure is arranged in a hole of the base body and is retracted with respect to an opening of the hole, the hole having an electrically isolating material located therein, the electrically isolating material covering the first region of the first electrically conductive structure; and wherein the first and the second electrically conductive structures each comprise a second region that is laterally spaced from the first region and is not covered by the base body so as to be accessible for external electrical connection.

2. An assembly comprising:

an electrically isolating base body;

a first electrically conductive structure embedded in the base body, the first electrically conductive structure configured to be coupled to a first electrical potential; and a second electrically conductive structure embedded in the base body, the second electrically conductive structure configured to be coupled to a second electrical potential that is different than the first electrical potential;

wherein the first and the second electrically conductive structures each comprise a first region that is not covered by the base body;

wherein the first region of the first electrically conductive structure is arranged in a hole of the base body and is retracted with respect to an opening of the hole, the hole having an electrically isolating material located therein, the electrically isolating material covering the first region of the first electrically conductive structure;

wherein the assembly is configured for a power module in which, during normal operation, a voltage difference between the first and the second electrical potential is at least 1000 V; and wherein the assembly is designed such that, without at least one first region of the first and the second electrically conductive structures being covered by the electrically isolating material, the power module would not fulfill the requirements of creepage and clearance distances according to IEC 60664-1:2020 and/or EN 501 50124-1:2017.

3. The assembly according to claim 1, wherein the first region is retracted with respect to the opening of the hole by at least 0.3 mm.

4. The assembly according to claim 1, wherein the opening has a diameter between 2 mm and 10 mm.

5. The assembly according to claim 1, wherein, with respect to a bottom side of the assembly, the first region of the first electrically conductive structure is arranged at a different height than a mounting region for a power electronic component of the power module.

6. The assembly according to claim 1, wherein:

the first and second electrically conductive structures each include two first regions;

a surface of the base body extends continuously between the two first regions of the first electrically conductive structure and the two first regions of the second electrically conductive structure; and the electrically isolating material covering the two first regions of the first electrically conductive structure is co-planar with the surface of the base body extending between the first regions.

7. The assembly according to claim 1, wherein the base body and the electrically isolating material are formed of different materials.

8. The assembly according to claim 2, wherein:

the first and second electrically conductive structures each comprise a second region not covered by the base body; and the second region, in contrast to the first region, is provided for externally electrically contacting the respective electrically conductive structure.

9. The assembly according to claim 1, wherein the electrically isolating material is a gel, and the gel has at least one property of:

(a) a dielectric constant is in a range between 2.5 to 3.5;

(b) a Young's modulus is smaller or equal to that of the material of the base body; and (c) a breakdown strength is greater than 10 kV/mm.

10. A power module comprising:

the assembly according to claim 1; and a power electronic component electrically connected to the first electrically conductive structure, wherein the power module is configured to be operated with a voltage difference between the first and the second electrically conductive structures.

11. The power module according to claim 10, wherein the power electronic component is embedded in the base body.

12. The power module according to claim 10, wherein the power electronic component comprises at least one transistor.

13. A power module comprising:

a carrier;

a power electronic component mounted to the carrier;

an electrically isolating base body overlying the power electronic component;

a first electrically conductive structure embedded in the base body and electrically coupled to the power electronic component, the first electrically conductive structure configured to be coupled to a first electrical potential, wherein the first electrically conductive structure includes a first terminal region to be coupled to the first electrical potential and first and second additional regions that are laterally spaced from the first terminal region and are not covered by the base body, the first and second additional regions being respectively located within first and second holes in the base body and covered by an electrically isolating material; and a second electrically conductive structure embedded in the base body and electrically coupled to the power electronic component, the second electrically conductive structure configured to be coupled to a second electrical potential that is different than the first electrical potential by at least 1000 volts during normal operation, wherein the second electrically conductive structure includes a second terminal region to be coupled to the second electrical potential and third and fourth additional regions that are laterally spaced from the second terminal region and are not covered by the base body, the third and fourth additional regions being respectively located within third and fourth holes in the base body and covered by an electrically isolating material.

14. The power module according to claim 13, wherein the power module is designed such that, without the first, second, third and fourth additional regions being covered by the electrically isolating material, the power module would not fulfill the requirements of creepage and clearance distances according to IEC 60664-1:2020 and/or EN 501 50124-1:2017.

15. The power module according to claim 13, wherein the first additional region is retracted with respect to an opening of the first hole by at least 0.3 mm and wherein the opening has a diameter between 2 mm and 10 mm.

16. The power module according to claim 13, wherein, with respect to a bottom side of the carrier, the first and second additional regions of the first electrically conductive structure are arranged at a different height than the first terminal region.

17. The power module according to claim 13, wherein:

a surface of the base body extends continuously between the first and second additional regions of the first electrically conductive structure and the third and fourth additional regions of the second electrically conductive structure;

the electrically isolating material covering the first and second additional regions of the first electrically conductive structure is co-planar with the surface of the base body extending between the first and second additional regions; and the electrically isolating material covering the third and fourth additional regions of the second electrically conductive structure is co-planar with the surface of the base body extending between the third and fourth additional regions.

18. The assembly according to claim 1, wherein the assembly is designed such that, without the first region of the first electrically conductive structure being covered by the electrically isolating material, the power module would not fulfill the requirements of creepage and clearance distances according to IEC 60664-1:2020 and/or EN 501 50124-1:2017.

19. A method of producing the assembly of claim 1, the method comprising:

forming the electrically isolating base body by molding the first and second electrically conductive structures with an electrically isolating mold material, wherein the first region is protected from being covered with the mold material by an auxiliary structure during the molding, the auxiliary structure being a holding structure for holding the electrically conductive structures in position during the molding;

removing the auxiliary structure after the molding thereby forming the hole of the base body so that the first region is exposed; and covering the first region of the first electrically conductive structure by filling the hole with the electrically isolating material.

20. The assembly according to claim 2, wherein the opening has a diameter between 2 mm and 10 mm and wherein the first region is retracted with respect to the opening of the hole by at least 0.3 mm.

* * * * *